(12) United States Patent
Knapp

(10) Patent No.: US 6,357,302 B1
(45) Date of Patent: Mar. 19, 2002

(54) CAPACITIVE SENSING ARRAY DEVICE INCLUDING ELECTROSTATIC DAMAGE PREVENTION MEANS

(75) Inventor: Alan G. Knapp, Crawley (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/668,544

(22) Filed: Sep. 25, 2000

(30) Foreign Application Priority Data

Sep. 24, 1999 (GB) .............................................. 9922570

(51) Int. Cl.⁷ ................................................. G01L 1/12
(52) U.S. Cl. ................................................. 73/862.626
(58) Field of Search ........................... 73/780, 862.046, 73/862.626

(56) References Cited

U.S. PATENT DOCUMENTS 5,153,685 A * 10/1992 Murata et al. .............. 357/23.6
5,325,442 A    6/1994 Knapp .......................... 382/4
5,952,588 A * 9/1999 Young ................... 73/862.626
5,978,496 A * 11/1999 Harkin ........................ 382/124
6,060,756 A * 5/2000 Machida et al. ............. 257/415

FOREIGN PATENT DOCUMENTS

WO    WO9740744    11/1997    ........... A61B/5/117
WO    WO9849691    11/1998    ........... H01B/7/004

\* cited by examiner

*Primary Examiner*—Max Noori
(74) *Attorney, Agent, or Firm*—Aaron Waxler

(57) ABSTRACT

A capacitive sensing array device, particularly a fingerprint sensing array device, includes an array of sense electrodes covered by a dielectric layer defining a sensing surface over which, for example, a person's finger is placed in use. Each sense electrode is associated with an overlying, electrically isolated, second electrode on the sensing surface. One or more adjacent conductor lines at a predetermined potential are also carried on the sensing surface, e.g. in the form of a grid surrounding and spaced from the second electrodes and the second electrode and/or its adjacent conductor line is shaped at a part thereof so as to encourage electrical flashover at a reduced potential level at that part and prevent damage being caused by electrostatic charges carried by a person's finger.

8 Claims, 2 Drawing Sheets

CAPACITIVE SENSING ARRAY DEVICE INCLUDING ELECTROSTATIC DAMAGE PREVENTION MEANS

BACKGROUND OF THE INVENTION

The present invention relates to a capacitive sensing array device comprising an array of sense electrodes carried on a substrate and covered by a layer of dielectric material defining a sensing surface.

SUMMARY OF THE INVENTION

A device of the above described kind and intended for sensing capacitively fingerprint patterns in particular is described in U.S. Pat No. 5,325,442. The device compares a plurality of sense elements arranged in a row and column matrix array. Each sense element consists of a sense electrode connected to an associated switching device in the form of, for example, a thin film transistor (TFT) and the switching devices of the array are connected to a peripheral drive circuit via sets of row and column address conductors carried on the substrate and extending between the sense electrodes. The drain electrode of each TFT is connected to the sense electrode of the sense element. When a finger is placed over the dielectric material, the sense electrodes together with the overlying layer of dielectric material and individual fingerprint portions constitute capacitors. The row address conductors are connected to a scan circuit which applies a selection signal to each row conductor in sequence to turn on the TFTs of the sense elements of the row. Simultaneously with a selection signal a potential is applied to the column address conductors to charge the capacitors. The individual capacitances of these capacitors depend on the spacing of the fingerprint portions from the sense electrodes, as determined by the presence of a ridge of a trough of the fingerprint, and are measured by sensing the charging current flowing in the column conductors during charging of the capacitors, using current or charge sensing amplifier circuits incorporated in the drive circuit. At the end of the address period, the TFTs are turned off and a gating signal is applied to the next row conductor to turn on the TFTs of the next row of sense elements. Each row of sense elements is addressed in this manner in turn and the variation in sensed capacitances produced over the array of sense elements by a fingerprint ridge pattern provides an electronic image or representation of the fingerprint pattern. In addition to the array being formed using thin film technology, with the transistors comprising thin film transistors (TFTs) on an insulating substrate, for example of glass or plastics, the array may alternatively comprise an integrated circuit using a silicon substrate.

In a modification of one embodiment of fingerprint sensing device described in this specification, the structure includes metal grounding conductors provided on the surface of the dielectric layer and overlying the spaces between the sense electrodes, either in a grid pattern or as linear conductors, for the purpose of improving electrical contact to the finger surface.

In a separate embodiment also described, each sense element is provided with a second, electrically isolated, electrode on the surface of the dielectric layer which is of a similar size to the sensing electrode and arranged overlying the sense electrode. The second electrodes are intended in use to be contacted and grounded by ridges of a person's fingerprint placed thereon so as to define together with their underlying sense electrodes and intervening dielectric material substantially identical, and more distinctive, capacitors at the fingerprint ridge locations.

A similar kind of structure, comprising an active matrix array with capacitive sensing electrodes but occupying a larger area and in which the pitch of the sense electrodes is increased could be used as a touch input device such as a graphics tablet, responsive to a person's finger or a stylus.

A problem with such a capacitive sensing array device is that an electrostatic charge from the body of a person touching the device or even bringing a finger into proximity to the sensing surface can cause damage, particularly to the switching devices which are susceptible to such charges.

It is an object of the present invention to provide an improved capacitive sensing array device which is less susceptible to damage being caused in this manner.

According to the present invention there is provided a capacitive sensing array device of the kind described in the opening paragraph wherein each sense electrode is associated with a second electrode provided on the sensing surface and overlying the sense electrode, wherein conductor lines connected to a source of predetermined potential extend over the sensing surface in the regions between the sense electrodes, each second electrode being in close proximity to, but spaced from, at least one of said conductor lines extending adjacent thereto, and wherein, with regard to each second electrode and a conductor line adjacent thereto, at least one is shaped at least at one part thereof in an electric field enhancing manner so as to encourage electrical flashover at that part at a reduced potential level.

As a result of using this structure, the risk of damage being caused to the device, and especially components such as the switching devices (e.g. transistors) associated with the sense electrodes, through electrostatic charges carried by a person when touching the device, or more especially when bringing a body part into proximity with the device, is considerably reduced. The invention involves recognition that two structural components which are described separately in different embodiments described in U.S. Pat. No. 5,325,442, namely the provision of (grounded) conductor lines and second, isolated, electrodes overlying the sense elements, can be used in combination beneficially for this purpose, and that by designing one or both of these components appropriately to define field enhancing regions the device can be afforded considerable protection from the unwanted effects of electrostatic discharges in a highly controlled and definable manner. Although the grounded conductor lines in the device of the embodiment described in the aforementioned publication could perhaps serve to dissipate charge carried by a persons finger when brought into direct physical contact therewith, there would inevitably be a substantial risk, particularly when a person's finger is merely being brought close to the sensing surface, of such charge jumping instead in an uncontrolled, ill-defined, way through the dielectric material to an underlying sense electrode and damaging the associated switching device rather than jumping to a conductor line. The provision of a second, isolated, electrode alone would not offer protection as electrostatic discharges could either merely jump via that second electrode to the underlying components, or if the charge only jumps to the overlying electrode then a large voltage excursion will occur on the overlying electrode which is capacitively coupled to the sense electrode causing a voltage change large enough to damage the switching devices.

The invention, on the other hand, provides reliable protection from the effects of electrostatic charges by rendering such effects harmless and limiting voltage swings occurring on the sense electrodes by ensuring that at higher voltages, i.e. levels which could cause damage or destruction to components, breakdown occurs in a reliable and controlled fashion whereby any voltage excursions on the sense electrodes are reduced and kept below a threshold at which damage can be caused. At relatively low voltages, impedance to ground is very high so the normal operation of the array is unaffected.

A further, secondary, advantage of the invention is that the conductor lines and second electrodes can together occupy a substantial proportion of the area of the sensing surface and by employing appropriately hard metal materials for these parts a higher degree of scratch resistance is afforded to the exposed surface of the sensor array.

The conductor lines may extend linearly between adjacent rows or columns of sense electrodes and preferably are in the form of a grid with each sense electrode being surrounded by a grid portion.

Either the second electrode or the adjacent conductor line, or both, may be shaped at one or more adjacent regions to provide field enhancement. Such shaping may typically take the form of sharp or other pointed projections. Thus, each second electrode and/or the portions of conductor line or lines extending adjacent thereto may have one or a plurality of shaped projections. Where projections are provided on both elements they preferably face one another to define thereat a reduced spacing where charge can readily flash over. The exact position of flash-over is thus highly defined.

Although the invention is particularly beneficial in capacitive type fingerprint sensing devices of the kind described for example in U.S. Pat No. 5,325,442, it of course can be beneficially applied in other kinds of capacitive sensing array devices where similar problems with electrostatic charge can be experienced.

BRIEF DESCRIPTION OF THE DRAWINGS

An embodiment of capacitive sensing array device, and more particularly a fingerprint sensing device, in accordance with the present invention will now be described, by way of example, with reference to the accompanying drawings, in which.

The figures are merely schematic and have not been drawn to scale.

The same reference numbers are used throughout the figures to indicate the same or similar parts.

DESCRIPTION OF THE PREFERRED EMBODIMENTS

Figure 1:
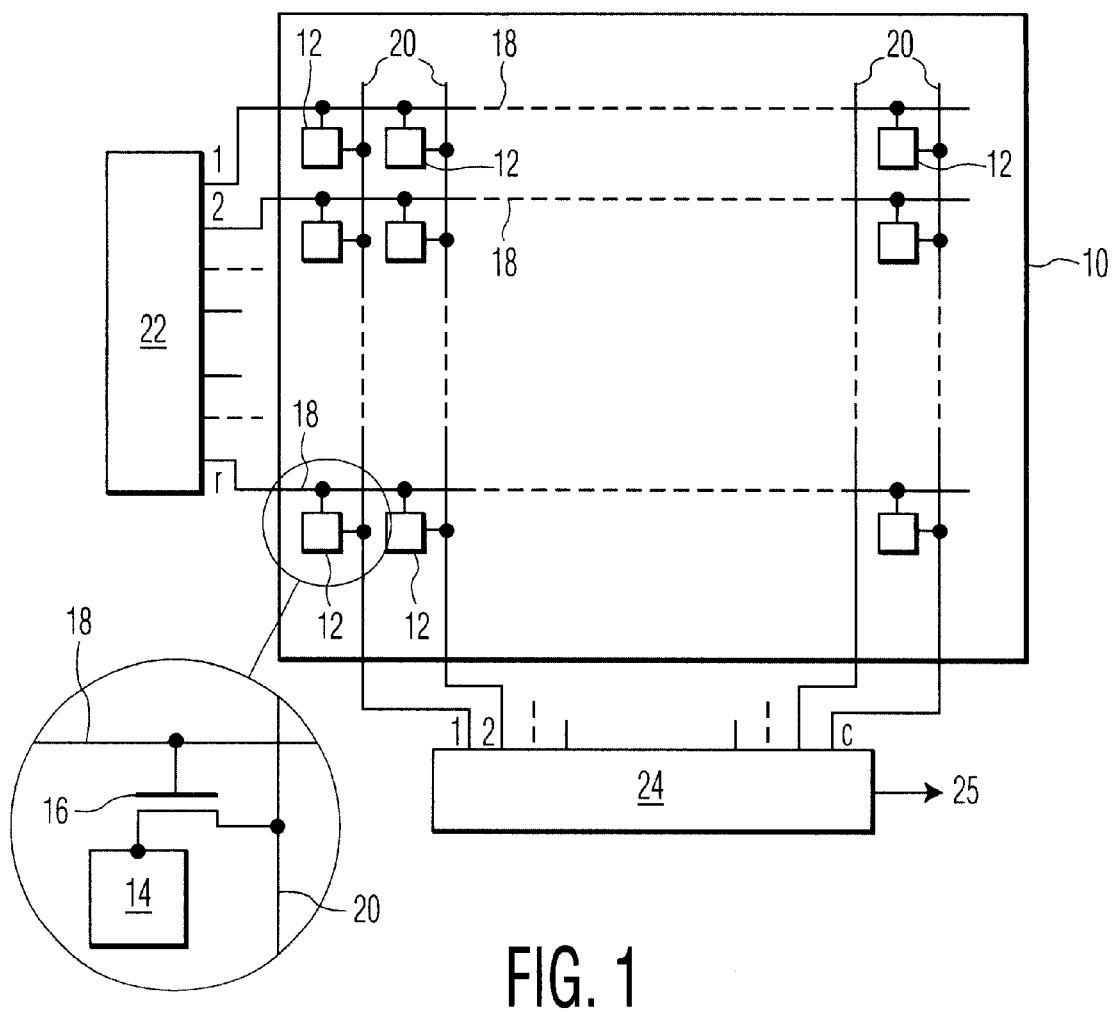
FIG. 1 is a simplified schematic diagram of a known capacitive fingerprint sensing array device.

Referring to FIG. 1, the capacitive fingerprint sensing array device is of the kind described in U.S. Pat. No. 5,326,442 to which reference is invited for a detailed description of its construction and operation. Briefly, the device comprises an active matrix addressed sensing pad 10 having an X-Y array of regularly-spaced sense elements 12 consisting of r rows (1 to r) each with c sense elements, which are operable to scan a fingerprint. Only a few rows and columns are shown for simplicity but in practice there could be around 512 rows and columns of sense elements occupying an area of approximately 2.5 cms square.

In this particular embodiment each sense element of the array comprises a sense electrode 14 connected to a switching device comprising a three terminal switching device 16 in the form of an n-type field effect transistor (FET). The X-Y array of sense elements is addressed via a set of regularly-spaced row (selection) address conductors 18 and a set of regularly-spaced column (sensing) address conductors 20 with individual sense elements being located at respective intersections of the two sets of conductors. All sense elements in the same row are connected to a respective, common, row conductor 18 and all sense elements in the same column are connected to a respective, common, column conductor 20. The row conductors 18 are connected at their one ends to a row drive circuit 22, comprising a digital shift register circuit, and the column conductors 20 are connected at their one ends to a sense circuit, 24. The gate electrode of the FET 16 of each sense element in one row is connected to the common row conductor 18, while its drain is connected to the sense electrode 14 and its source is connected to the column conductor 20.

The sense elements 12 and address conductors 18 and 20 of the pad 10 are fabricated using standard thin film technology as used in active matrix addressed display devices for example, involving the deposition and definition by photolithographic processes of a number of layers of conductive, insulating, and semiconducting materials on an insulating substrate, and as such it is not thought necessary to describe here the manner of fabrication in detail. The electrodes 14 and sets of address conductors 18 and 20 can be formed of metal and the FETs 16 can be formed as amorphous silicon or polycrystalline silicon thin film transistors (TFTs) using an appropriate insulating substrate e.g. of glass, polymer, or quartz. More than one switching device may be used in each sense element, for example as described in EP-A-0836417 (PHB 34068). The switching devices need not comprise FETs but could instead be diode structures, for example thin film p-i-n devices or other two terminal non-linear switching devices connected between the row conductor and the sense electrode, as described in EP-A-0920669 (PHB 34153). While it is preferred to use thin film device technology, it will be appreciated that the sensing pad 10 could alternatively be fabricated as a chip using a (Si) semiconductor wafer and integrated circuit technology.

In accordance with the present invention, the structure of this known device is modified so as to prevent damage being caused due to electrostatic charge from the body of a person touching, or being brought into close proximity to, the device.

Figure 2:
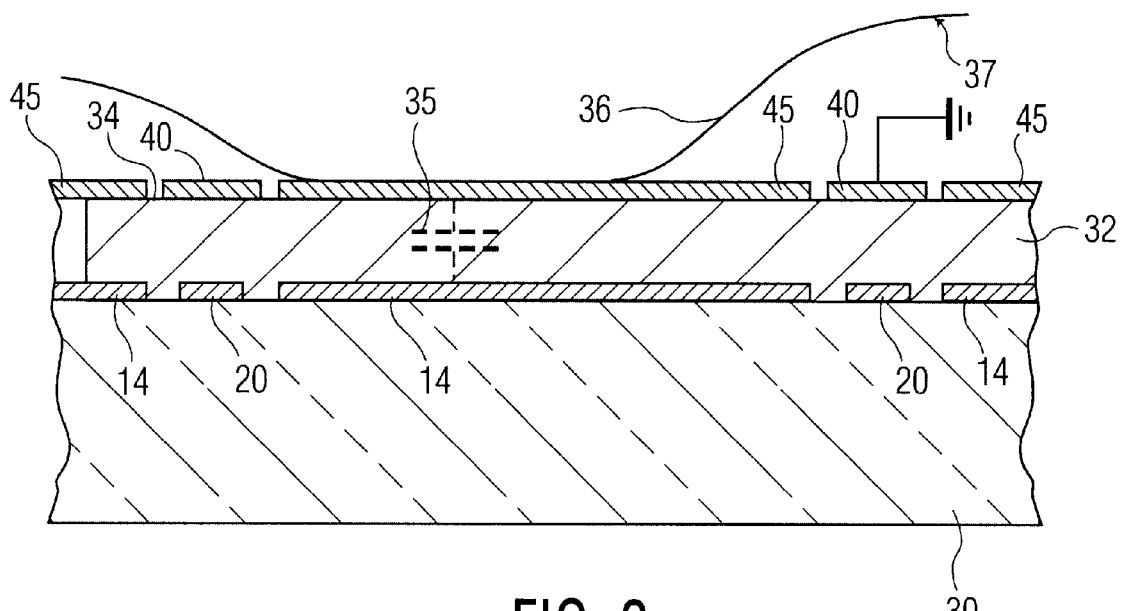
FIG. 2 is a schematic, cross-sectional, view through part of an embodiment of a capacitive sensing array device in accordance with the present invention.
Figure 3:
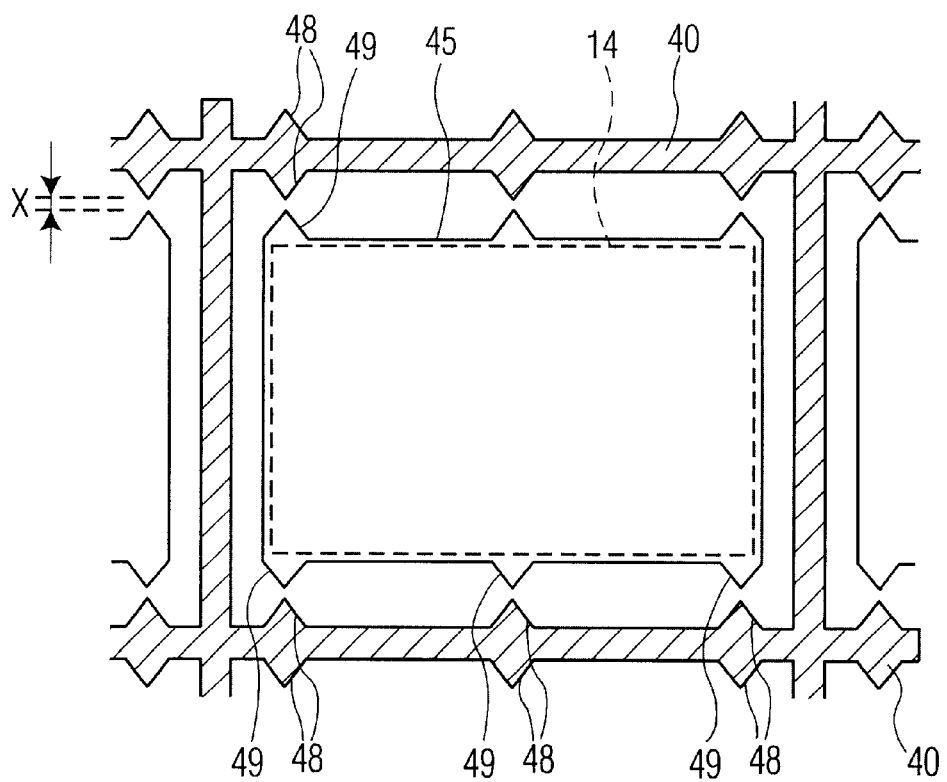
FIG. 3 is a plan schematic view of part of the sensing array device of FIG. 2.

FIG. 2 is a schematic cross-sectional view through a representative part of the sensing pad in an embodiment of such a modified structure according to the present invention and FIG. 3 is a schematic plan view of a part of this modified device.

The part of the device illustrated in FIG. 2 comprises one complete sensing element, the other sense elements of the array being constructed in substantially identical manner. The TFT switching devices 16, which are not visible in this section, are formed on an insulating substrate 30 from a deposited layer of amorphous or polycrystalline silicon material, constituting the TFTs' channels, with a deposited layer of dielectric material, for example silicon nitride, constituting the gate insulator layers of the TFTs. The sense electrodes 14, comprising regularly spaced and equally sized rectangular conductive pads, and the set of address conductors 20 extending therebetween are defined from a common deposited metal layer. Integral extensions of the electrodes 14 respectively form the drain contacts of the TFTs 16 and integral extensions of the conductors 20 form the source contacts of the TFTs. Insulating material is provided between the conductors 18 and 20 at the regions where they intersect. The set of row conductors 18, not visible in FIG. 2, is formed from a deposited metal layer with each row conductor extending between adjacent rows of sense electrodes 14 and having integral extensions spaced along its length which serve as gate electrodes of the TFTs 16.

To complete the basic structure of the sensing device, a dielectric film 32, for example of silicon nitride or polyimide, and of a predetermined thickness, is deposited completely over the pixel array on the substrate 30 to provide a continuous sensing surface 34 spaced from, and substantially parallel to, the substrate surface.

The physical dimensions of the sense electrodes 14 are chosen in accordance with the desired resolution characteristics in fingerprint sensing. By way of example, the sense electrodes may have a pitch of around 50 to 100 micrometers in both the row and column directions. The thickness of the insulating film 32 is selected taking into account the value of the relative permittivity of the material used and for example, in the case of the material having a relative permittivity of approximately 6, a film thickness of around 0.1 micrometers may be used, with a sense electrode around 50 micrometers square.

Directly on the upper surface of the dielectric layer 32 there is provided a conductor line structure 40. In this particular embodiment, the conductor line structure comprises a conductive grid of deposited metal with portions of the grid extending alongside the rows and columns of sense elements at the regions of the surface 34 overlying the spaces between the sense electrodes 14 and with each grid cell completely surrounding a respective sense electrode. Alternatively, however, the conductor line structure may be provided as a set of linear conductors extending over the spaces between adjacent rows, or columns, of sense electrodes, for example with each conductor line overlying a respective row or column address conductor.

In operation of the device, the grid is held at a predetermined potential relative to the row and column conductor drive circuits 22 and 24, for example ground.

At the location of each sense electrode 14, there is also provided directly on the surface of the layer 32 a second electrode 45 which is of substantially similar shape and size to the underlying sense electrode 14 and aligned vertically therewith. The second electrodes 45 are formed as discrete, electrically isolated, conductive pads.

The conductor line structure 40 and the array of second electrodes 45 are formed by appropriately patterning photolithographically a single layer of metal or other suitable conductive material deposited over the surface of the dielectric layer 32.

Referring specifically to FIG. 3, it is seen that the horizontal (row direction) arms of the grid structure 40 and the upper and lower side edges of the second electrode of a sense element have parts, as indicated at 48 and 49 respectively, which define sharp projections. In this example, the projections are shaped to define pointed triangles but other pointed or sharp shapes suitable for promoting electrical field enhancement at these parts could be employed instead. Six such projections are provided on the electrode 45 in this example, three on each side and spaced equidistantly, and a corresponding number of projections are provided on the grid 40, each of which is aligned with a respective projection of the electrode 45 such that the facing tips of each associated pair of projections define a small gap (x) of predetermined dimension and less than the spacing between the electrode 45 and the grid elsewhere.

It will be appreciated that various alternative projection arrangements are possible. The number of projections on the electrode 45 could be greater, or less, than six. For example, just one or two projections may be present. The position of the projections can be different to that shown. For example they may be provided instead, or in addition, on one or both vertical (column direction) side edges of the electrode 45, with aligned projections being provided on the vertical arms of the grid appropriately. Moreover, it is not essential that facing projections be provided on both the grid and the electrode 45. Such projections could be provided solely on the electrode 45 or the grid 40.

In operation of this sensing device, a finger whose print is to be scanned is placed on the sensing surface 34. Physical contact with the a second electrode 45 then occurs at the ridges of the fingerprint, as illustrated in FIG. 2 where one ridge 36 of part of the finger surface 37 is depicted, which grounds the electrode 45. Troughs in the fingerprint profile are spaced from the surface 34 and the second electrode 45 by a considerably greater distance. The ridged finger surface is therefore spaced from the array of electrodes 14 by a minimum distance determined by the thicknesses of the thin film 32 and the electrodes 45. Each sense electrode 14 and either the respective overlying portion of the finger surface at troughs or the electrode 45 at ridges form opposing plates of a capacitor 35, as depicted by dotted lines in FIG. 2, with the upper plate, constituted by the finger surface portion or the electrode 45, being effectively at ground potential. The capacitances of these individual capacitors varies as a function of the spacing between the finger surface and the sensing surface 34, with larger capacitances occurring where the fingerprint ridges are in contact with the electrode 45 and smaller capacitances occurring where the troughs in the fingerprint overlie the sense electrodes 14. The variation in capacitances produced over the array of sensing elements 12 of the pad 10 by a fingerprint ridge pattern thus provides an electronic image of the fingerprint surface.

These capacitances are sensed within the sensing device and an output provided indicative of the variation, and hence the pattern of the fingerprint. The actual sensing of the capacitances of the individual sense elements 12 in the array is accomplished in a manner as described in the aforementioned patent specifications to which reference is invited for further information.

The purpose of the structure on the surface of the layer 32 is to prevent or at least reduce the possibility of electrostatic damage being caused to the switching devices of the sense elements when the device is being used by a person who has acquired a significant electrical charge, which charge could otherwise be discharged into the switching devices. In the known device, any charge on a person's finger as it touches, or approaches, the sensing element array is likely to be discharged into the sense electrode, and hence to the associated switching device.

The arrangement depicted in FIGS. 2 and 3 is intended to ensure that the voltage excursion on a sense electrode 14 is limited. To this end, the charge on a person's finger is either discharged directly onto the grounding grid 40 or is collected on the second electrode 45. There is a highly non-linear impedance between this electrode and the surrounding grid structure. At low voltage, the impedance to ground is very high so that normal operation of the sense array is unaffected, but as the voltage increases to levels which could damage the switching devices the impedance falls, allowing the charge to be conducted away to ground and limiting the voltage excursion on the sense electrode.

The gap between the second electrode 45 and the surrounding grid 40 is small and any significant change in potential on this electrode beyond a level predetermined by the design of the combined electrode structure and grounding grid can result in a flash-over to the grounding grid. By providing the sharp projections 48, 49, whose tips are physically closest together, and at a predetermined minimum spacing x, electrical fields at these parts are enhanced and consequently the voltage at which such breakdown occurs is reduced and can be better controlled. The maximum amplitude of any voltage excursion on the electrode 45 is limited and thus the risk of any charge jumping through the dielectric layer 32 is therefore minimised, or if this breakdown of the dielectric layer does not occur the amplitude of any possible voltage excursion on the sense electrode 14 is limited. Importantly, the provision of the projections means that the region or regions where flash-over will occur is highly predictable.

In normal operation, when no fingerprint ridge is present on the second electrode 45, then this electrode floats and the capacitance between the sense electrode 14 and ground is relatively low. When a fingerprint ridge touches the second electrode 45, the electrode is effectively grounded via the finger impedance and the capacitance to ground increases, as in the known sensor device.

The drive circuit of the device, comprising the row driver circuit 22 and the sensing circuit 24, may be integrated on the same substrate as that carrying the array of sense elements and fabricated simultaneously with the components of the sense elements thereby providing an inexpensive and compact sensing device.

Figure 4:
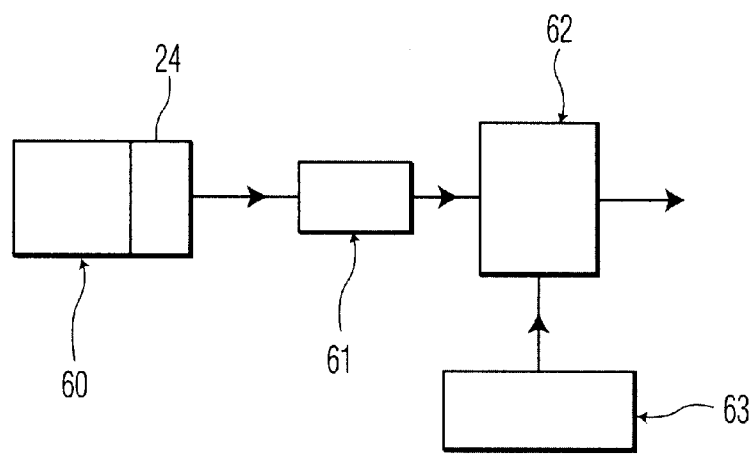
FIG. 4 illustrates in simple block diagram form a fingerprint recognition system using the sensing device of FIGS. 2 and 3.

FIG. 4 shows in schematic block form a fingerprint recognition system incorporating the sensing device, here represented by the block 60. The system includes means responsive to an output from the sensing circuit 24 of the device to provide characteristical data, according to the sensed capacitances, of a sensed fingerprint, and means for comparing said characteristical data with stored characteristical data for one or more fingerprints. If required, the output obtained from the sensing device is provided in a form comparable to the video output provided by an image sensor in known optical fingerprint sensing devices. Accordingly, and as will be apparent to skilled persons, components of the system, other than the sensing device, can be generally of the kind employed in systems using optical sensing devices. The characteristical data may take the form of information regarding the orientation of ridge lines and relative positions of minutiae, that is, the endings and bifurcations of the lines. The processing of information obtained from the sensing device to produce and compare characteristical data can follow known schemes and techniques. Verification could be obtained by making use of topological features in addition to the spatial positions of minutiae, although of course use may be made only of information in respect of the two-dimensional ridge patterns to simplify the processing necessary if less accuracy is acceptable. Briefly, the output from the device 60, suitably conditioned, is fed to an analysis circuit 61 which is programmed to detect the characterising features of the fingerprint. Data from the circuit 61 is supplied to a computer 62 which through standard algorithms compares the data with data for a plurality of fingerprints, or a single fingerprint depending on whether the system is used for identification or merely verification purposes, held in a storage device 63 and which provides an output in accordance with whether or not a match has been found.

The circuit 61 is programmed to utilise, with appropriate discrimination to select particular output signal values from the device 60, specific information representative of the two dimensional ridge pattern in the nature of a binary image similar to that obtained from known optical sensing devices.

From reading the present disclosure, other modifications will be apparent to persons skilled in the art. Such modifications may involve other features which are already known in the field of fingerprint sensing and components parts therefor and which may be used instead of or in addition to features already described herein.

What is claimed is:

1. A capacitive sensing array device comprising an array of sense electrodes carried on a substrate and covered by a layer of dielectric material defining a sensing surface, each sense electrode is associated with a second electrode provided on the sensing surface and overlying the sense electrode, said capacitive sensing array device further comprising conductor lines connected to a source of predetermined potential extend over the sensing surface in the regions between the sense electrodes, each second electrode being in close proximity to, but spaced from, at least one of said conductor lines extending adjacent thereto, and wherein, with regard to each second electrode and a conductor line adjacent thereto, at least one is shaped at least at one part thereof in an electric field enhancing manner so as to encourage electrical flash-over at that part at a reduced potential level.

2. A capacitive sensing array device according to claim 1, wherein the conductor lines are provided in the form of a grid with each sense electrode being surrounded by a grid portion.

3. A capacitive sensing array device according to claim 1, wherein at least one of the second electrode and an adjacent conductor line is provided with one or more sharp projections defining a reduced gap of predetermined dimension between the second electrode and the adjacent conductor line.

4. A capacitive sensing array device according to claim 3, wherein aligned projections are provided on both the second electrode and the adjacent conductor line.

5. A capacitive sensing array device according to claim 1, wherein each sense electrode is coupled to a switching device carried on the substrate beneath the layer of dielectric material which is connected to an address conductor which underlies the conductor line.

6. A capacitive sensing array device according to claim 5, wherein the switching device comprises a thin film diode or transistor.

7. A capacitive sensing array device according to claim 1, wherein the sensing array device is a fingerprint sensing device.

8. A fingerprint sensing system comprising a fingerprint sensing device according to claim 7, means responsive to an output from the sensing device to provide characteristical data of a sense fingerprint, and means for comparing said characteristical data with stored characteristical data for one or more fingerprints.

* * * * *